(12) United States Patent
Yang

(10) Patent No.: US 8,574,986 B2
(45) Date of Patent: Nov. 5, 2013

(54) METHOD FOR FABRICATING NONVOLATILE MEMORY DEVICE

(75) Inventor: Young-Ho Yang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 135 days.

(21) Appl. No.: 13/331,983

(22) Filed: Dec. 20, 2011

(65) Prior Publication Data

US 2012/0282755 A1    Nov. 8, 2012

(30) Foreign Application Priority Data

May 4, 2011    (KR) ........................ 10-2011-0042546

(51) Int. Cl.
*H01L 21/336*    (2006.01)

(52) U.S. Cl.
USPC ........... 438/257; 438/201; 438/211; 438/261; 438/593; 257/E21.422

(58) Field of Classification Search
USPC ....... 438/201, 211, 257, 261, 593, FOR. 189, 438/FOR. 203, FOR. 212; 257/E21.422
See application file for complete search history.

(56) References Cited

U.S. PATENT DOCUMENTS

2009/0207667 A1 *  8/2009  Park et al. ................ 365/185.33
2010/0110753 A1 *  5/2010  Slesazeck et al. ............ 365/145
2011/0117721 A1 *  5/2011  Kim et al. ..................... 438/428

* cited by examiner

*Primary Examiner* — Thanh V Pham
(74) *Attorney, Agent, or Firm* — IP & T Group LLP

(57) ABSTRACT

A method for fabricating a nonvolatile memory device includes forming a substrate structure having a tunnel dielectric layer and a floating-gate conductive layer formed over an active region defined by a first isolation layer forming a first inter-gate dielectric layer and a first control-gate conductive layer over the substrate structure, forming a trench by etching the first control-gate conductive layer, the first inter-gate dielectric layer, the floating-gate conductive layer, the tunnel dielectric layer, and the active region to a given depth, forming a second isolation layer to fill the trench; and forming a second control-gate conductive layer over the resultant structure having the second isolation layer formed therein.

11 Claims, 6 Drawing Sheets

METHOD FOR FABRICATING NONVOLATILE MEMORY DEVICE

CROSS-REFERENCE TO RELATED APPLICATIONS

The present application claims priority of Korean Patent Application No. 10-2011-0042546, filed on May 4, 2011, which is incorporated herein by reference in its entirety.

BACKGROUND

1. Field

Exemplary embodiments of the present invention relate to a method for fabricating a nonvolatile memory device, and more particularly, to a method for fabricating a nonvolatile memory device including an isolation layer.

2. Description of the Related Art

A nonvolatile memory device refers to a memory device which maintains data stored therein even though power supply is cut off. Currently, a variety of nonvolatile memory devices, for example, a NAND-type flash memory and on the like, have been widely used.

Recently, with the increase in integration degree of semiconductor devices, the importance of device isolation technology for electrically isolating adjacent devices has been further increased. A shallow trench isolation (STI) method is typically used as one of device isolation technologies of a semiconductor process and in the STI, a trench defining an active region is formed in a semiconductor substrate, and then filled with a dielectric material to form an isolation layer.

Meanwhile, as the distance between semiconductor devices is reduced, there may be a limitation in increasing the integration degree through the conventional technology which forms only one device in the left and right sides of the isolation layer having an STI structure. Furthermore, as the aspect ratio of the trench increases, a burial characteristic may be degraded. For example, a void may occur in the STI structure.

SUMMARY

An Exemplary embodiment of the present invention is directed to a method for fabricating a nonvolatile memory device including an isolation layer which is capable of improving a device isolation characteristic while increasing the integration degree of the nonvolatile memory device.

In accordance with an exemplary embodiment of the present invention, a method for fabricating a nonvolatile memory device includes forming a substrate structure having a tunnel dielectric layer and a floating-gate conductive layer formed over an active region defined by a first isolation layer, forming a first inter-gate dielectric layer and a first control-gate conductive layer over the substrate structure, forming a trench by etching the first control-gate conductive layer, the first inter-gate dielectric layer, the floating-gate conductive layer, the tunnel dielectric layer, and the active region to a given depth, forming a second isolation layer to fill the trench, and forming a second control-gate conductive layer over the resultant structure having the second isolation layer formed therein.

DETAILED DESCRIPTION

Figure 1:
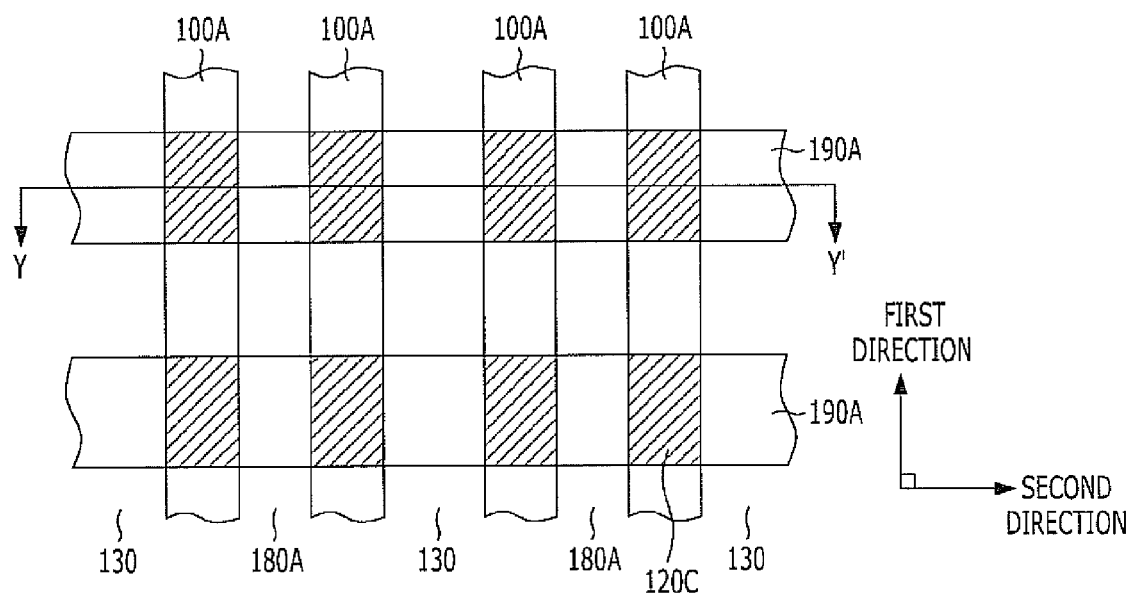
FIG. 1 is a layout diagram of a nonvolatile semiconductor device in accordance with a first exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a layout diagram of a nonvolatile semiconductor device in accordance with a first exemplary embodiment of the present invention. FIGS. 2A to 2H are cross-sectional views explaining a method for fabricating the nonvolatile memory device in accordance with the first exemplary embodiment of the present invention. In particular, FIG. 2H is a cross-sectional view of the nonvolatile memory device in accordance with the first exemplary embodiment of the present invention, and FIGS. 2A to 2G illustrate examples of intermediate processes for fabricating the device shown in FIG. 2H. The cross-sectional views are taken along line Y-Y' of FIG. 1.

Referring to FIGS. 1 and 2A to 2H, the method for fabricating a nonvolatile memory device in accordance with the first exemplary embodiment of the present invention will be described hereinafter.

Figure 2A:
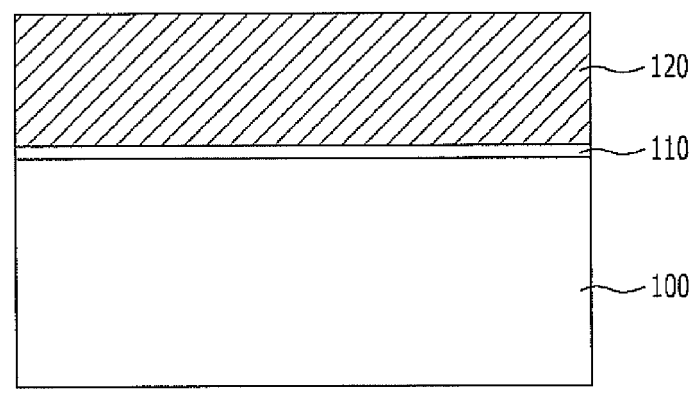
FIGS. 2A to 2H are cross-sectional views explaining a method for fabricating the nonvolatile memory device in accordance with the first exemplary embodiment of the present invention.

Referring to FIG. 2A, a tunnel dielectric layer 110 and a floating-gate conductive layer 120 are formed over a semiconductor substrate 100. Meanwhile, before the tunnel dielectric layer 110 is formed, an ion implantation process may be performed to form an active region in the semiconductor substrate 100. The active region will be described below in detail.

The tunnel dielectric layer 110 may be formed of an oxide layer to have a thickness of 50 to 100 Å by oxidizing the semiconductor device 100 using, for example, a gas mixture of $O_2$ and $H_2$. At this time, in order to control a tunneling effect of hot electron, annealing may be in-situ or ex-situ performed at a temperature of 850 to 950° C. using, for example, NO or $NO_2$ gas.

The floating-gate conductive layer 120 may be formed of, for example, a polycrystalline or amorphous silicon layer. The silicon layer may include a double layer composed of upper and lower layers having different phosphorous (P) concentrations. The lower layer of the double layer may be formed by depositing an undoped silicon layer to 200 to 500 Å using source gas such as $SiH_4$ or $SiH_2Cl_2$. At this time, in order to remove native oxide existing on the surface of the lower layer, a wet cleaning process using a HF-based chemical may be additionally performed. The upper layer of the double layer may be formed by depositing a doped silicon layer to 500 to 2500 Å using source gas such as $SiH_4$ or $SiH_2Cl_2$. At this time, in-situ doping may be performed by using a P source having a dopant concentration of 1.0E19 atoms/cm$^3$ to 1.0E21 atoms/cm$^3$.

Figure 2B:
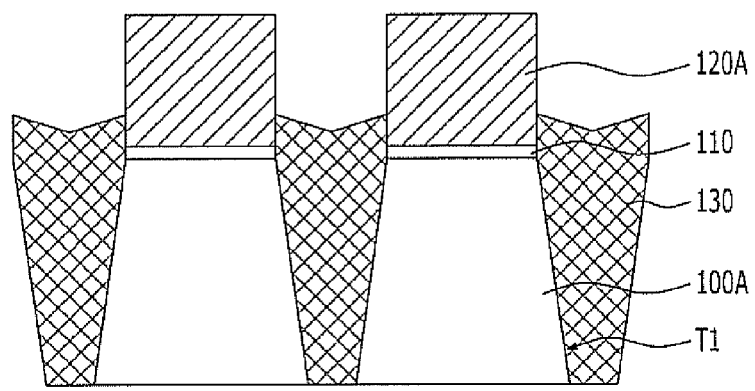

Referring to FIG. 2B, a photoresist pattern (not illustrated) is formed over the floating-gate conductive layer 120 so as to expose a region where a first trench T1 is to be formed. Then, the floating-gate conductive layer 120, the tunnel dielectric layer 110, and the semiconductor substrate 110 are etched using the photoresist pattern as an etch mask to form the first trench T1 for isolation, an active region 100A defined by the first trench T1, and a primary conductive layer pattern 120A over the active region 100A. At this time, the first trench T1 may be extended in a first direction crossing the cross-sectional direction as shown in FIG. 1.

In order to cure an etch damage occurring in the process, a thermal oxidation process may be additionally performed to form a thin oxide layer on the surface of the first trench T1.

A first isolation layer 130 is formed to fill the first trench T1. In this case, the upper surface of the first isolation layer 130 is set at a lower level than the upper surface of the primary conductive layer pattern 120A.

Specifically, the formation of the first isolation layer 130 may be performed by the following process: an isolation dielectric layer (not illustrated) is formed over the resultant structure including the first trench T1, a planarization process is performed until the upper surface of the primary conductive layer pattern 120A is exposed, and the isolation dielectric layer between the primary conductive layer patterns 120A is removed by a certain amount through a wet or dry etching process. Here, the planarization process may include chemical mechanical polishing (CMP), and the isolation dielectric layer between the primary conductive layer patterns 120 may be recessed in such a manner that the upper surface of the first isolation layer 130 is set at a higher position by about 50 Å to about 250 Å than the upper surface of the active region 100A.

Figure 2C:
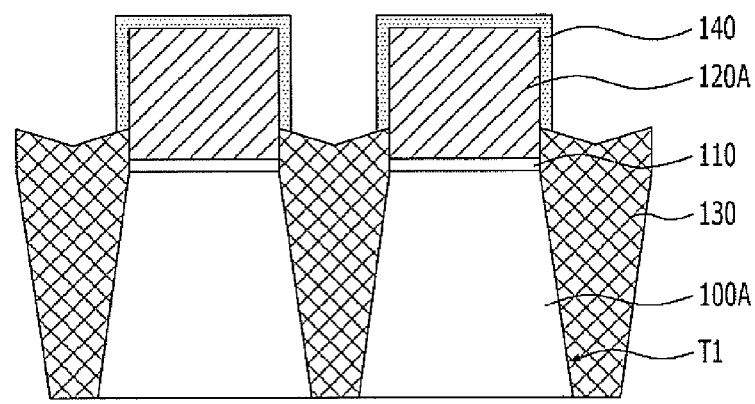

Referring to FIG. 2C, a first inter-gate dielectric layer 140 is conformally formed on the surface of the primary conductive layer pattern 120A. At this time, the first inter-gate dielectric layer 140 includes, for example, oxide-nitride-oxide (ONO), $Al_2O_3$, or $Hf_xO_y$.

Specifically, ONO may be formed by employing low pressure chemical vapor deposition (LP-CVD) or atomic layer deposition (ALD) in which a gas mixture obtained by mixing, for example, $SiH_4$ or $SiH_2Cl_2$ with $N_2O$ or $NH_3$, is used as a source. At this time, oxide may be deposited under a temperature condition of about 780° C. to about 850° C., and nitride may be deposited under a temperature condition of about 600° C. to about 750° C.

Furthermore, a gas mixture of $O_2$ and $H_2$ may be used to additionally perform a high-temperature annealing process and an oxidation process under a temperature condition of about 600° C. to about 900° C.

Figure 2D:
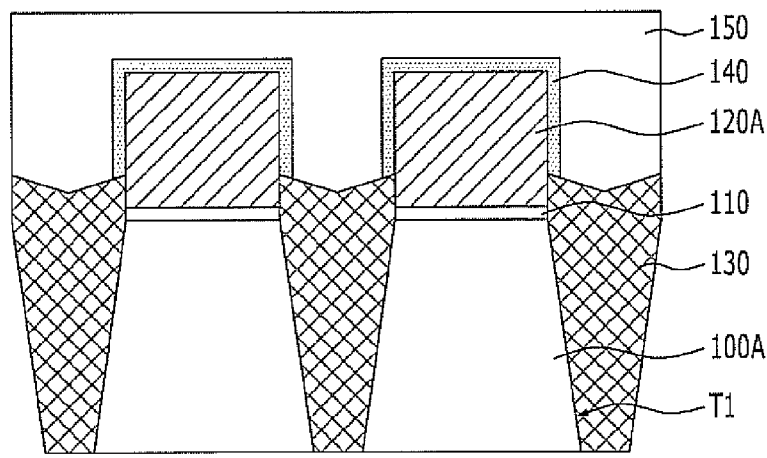

Referring to FIG. 2D, a first control-gate conductive layer 150 is formed over the first inter-gate dielectric layer 140 and the first isolation layer 130. The first control-gate conductive layer 150 may include a conductive material, for example, polysilicon.

Figure 2E:
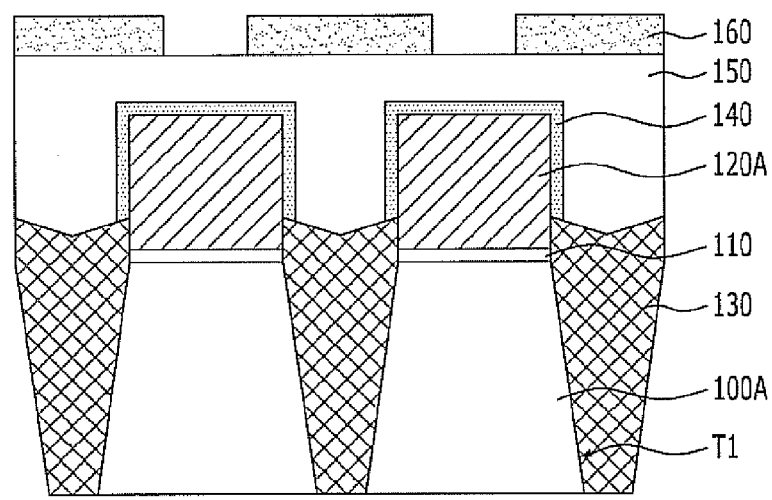

Referring to FIG. 2E, a photoresist pattern 160 is formed over the first control-gate conductive layer 150 so as to expose the central portion of the primary conductive layer pattern 120A. At this time, the photoresist pattern 160 may be extended in the first direction crossing the cross-sectional direction shown in FIG. 1.

Figure 2F:
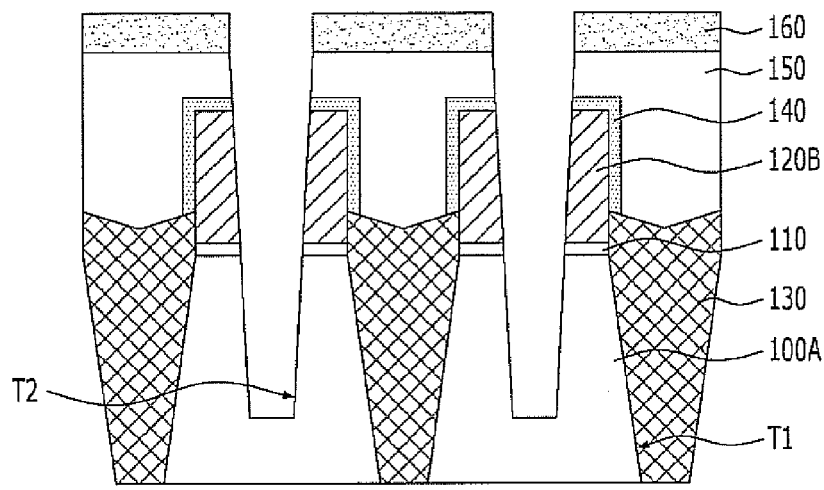

Referring to FIG. 2F, the first control-gate conductive layer 150, the first inter-gate dielectric layer 140, the primary conductive layer pattern 120A, the tunnel dielectric layer 110, and the active region 100A are etched using the photoresist pattern 160 as an etch mask to form a second trench T2 for isolation and secondary conductive patterns 120B isolated by the second trench T2. At this time, the second trench T2 may be extended in the first direction, like the first trench T1, as shown in FIG. 1.

In order to cure an etch damage occurring during the process, a thermal oxidation process may be additionally performed to form a thin oxide layer on the surface of the second trench T2.

Meanwhile, the bottom surface of the second trench T2 may be positioned at a higher level than the bottom surface of the first trench T1. In this case, it may be possible to prevent a burial defect such as void formation, which may occur when the depth of the trench is increased.

Figure 2G:
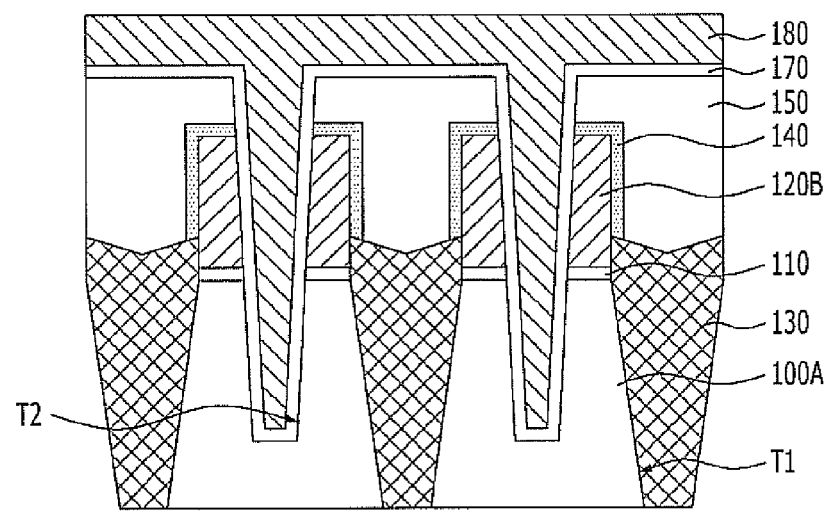
Figure 2H:
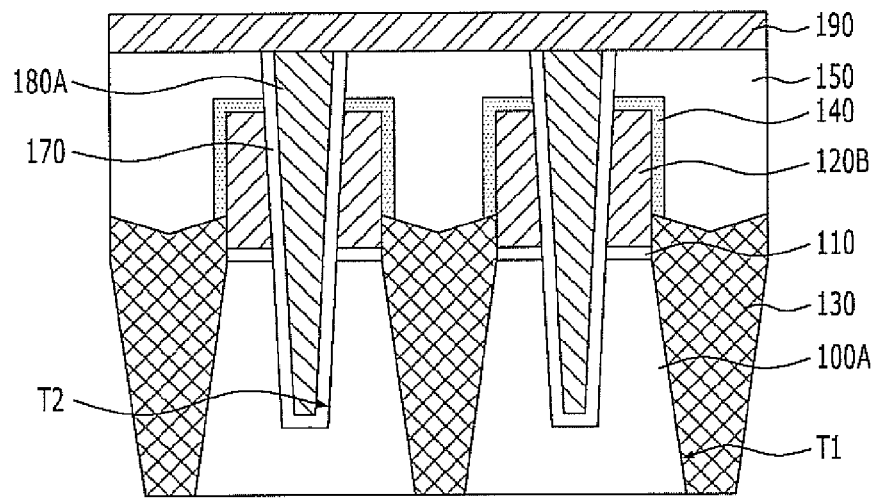

Referring to FIG. 2G, the photoresist pattern 160 is removed, and a liner layer 170 is formed on the entire surface of the resultant structure having the second trench T2 formed therein. At this time, the liner layer 170 serves to prevent the oxidation of the inner walls of the second trench T2 and relieve a stress applied to the inner walls of the second trench T2. The liner layer 170 may be formed of, for example, nitride.

An isolation dielectric layer 180 is formed over the liner layer 170. The isolation dielectric layer 180 is formed to have a thickness enough to fill the second trench T2. The isolation dielectric layer 180 may be formed by a process of performing, for example, LP-CVD to deposit an oxide layer.

Referring to FIGS. 1 and 2H, a planarization process such as CMP is performed until the upper surface of the first control-gate conductive layer 150 is exposed. Accordingly, the isolation dielectric layer 180 existing on the upper surface of the first control-gate conductive layer 150 is removed, and the isolation dielectric layer 180 buried in the second trench T2 is referred to as a second isolation layer 180A.

A second control-gate conductive layer 190 is formed over the entire surface of the resultant structure exposing the upper surface of the first control-gate conductive layer 150. The second control-gate conductive layer 190 may include a conductive material, for example, polysilicon.

A line-type hard mask pattern (not illustrated) is formed over the second control-gate conductive layer 190 so as to extend in the cross-sectional direction (the second direction shown in FIG. 1). Then, the second control-gate conductive layer 190, the second isolation layer 180A, the liner layer 170, the first control-gate conductive layer 150, the first inter-gate dielectric layer 140, the second conductive layer pattern 120B, and the tunnel dielectric layer 110 are etched using the hard mask pattern as an etch mask.

Through this process, floating gates 120C arranged in a matrix type over the active region 100A are formed from the line-type secondary conductive layer patterns 120B.

Furthermore, the stacked structure of the first control-gate conductive layer 150 and the second control-gate conductive layer 190, which are etched by the process, serves as a control gate 190A and has a line shape extending in the cross-sectional direction while overlapping and interposing the first inter-gate dielectric layer 140 and the floating gates 120C arranged in the cross-sectional direction.

In the above-described method for fabricating a nonvolatile memory device in accordance with the first exemplary embodiment of the present invention, the second isolation layer 180A for isolating the gate pattern formed over the active region defined by the first isolation layer 130 into two parts is formed. Therefore, it may be possible to double the integration degree of the nonvolatile memory device.

Furthermore, as the bottom surface of the second trench T2 is positioned at a higher level than the bottom surface of the first trench T1, it may be possible to prevent a burial defect such as void formation, which may occur when the depth of the trench is increased. Therefore, it may be possible to improve the device isolation characteristic.

Figure 3A:
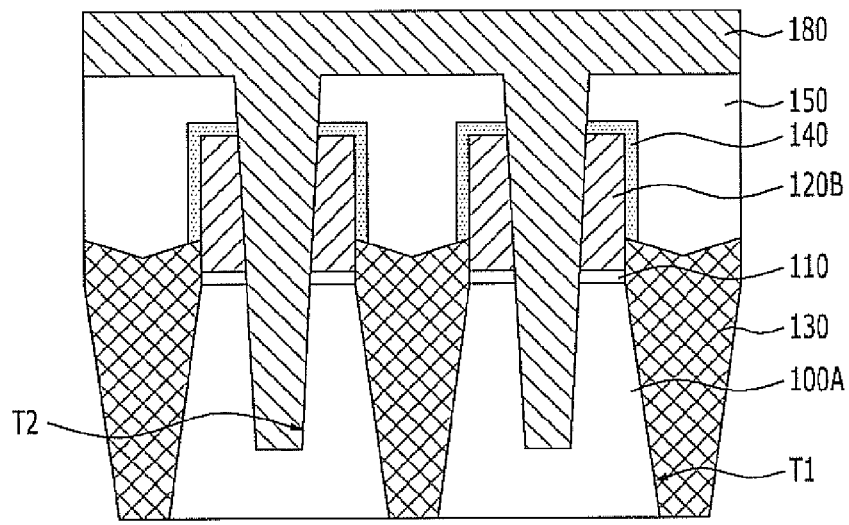
FIGS. 3A to 3C are cross-sectional views explaining a method for fabricating a nonvolatile memory device in accordance with a second exemplary embodiment of the present invention.
Figure 3B:
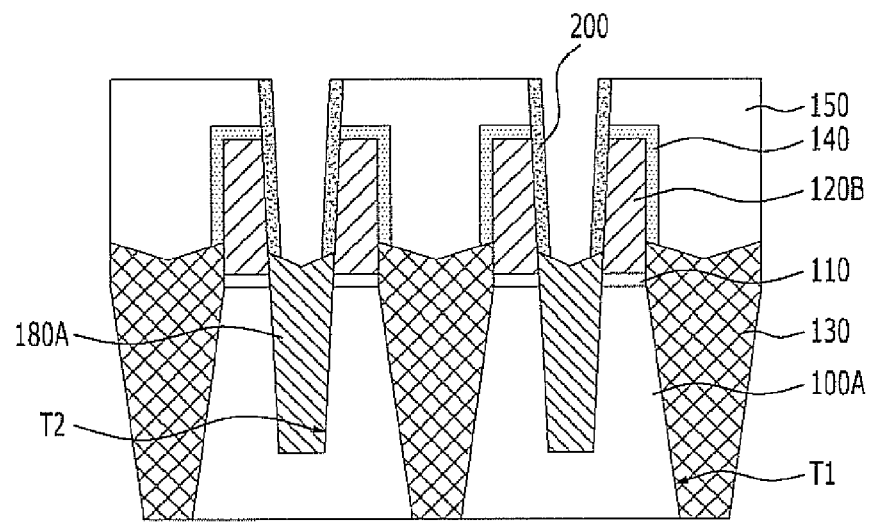
Figure 3C:
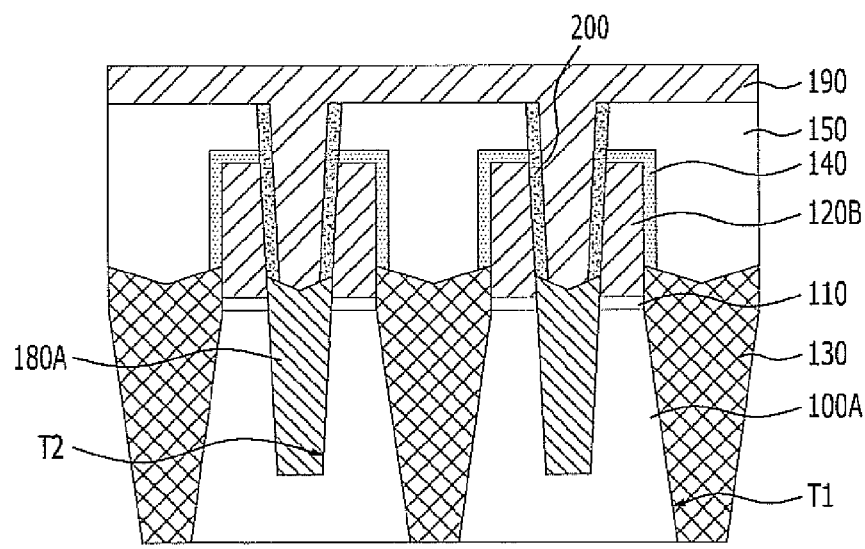

FIGS. 3A to 3C are cross-sectional views explaining a method for fabricating a nonvolatile memory device in accordance with a second exemplary embodiment of the present invention. The layout diagram of the nonvolatile memory device in accordance with the second exemplary embodiment of the present invention is the same as that of the nonvolatile memory device in accordance with the first exemplary embodiment of the present invention. In the second embodiment of the present invention, the detailed descriptions of the same components as those of the first embodiment of the present invention will be omitted. First, the processes of FIG. 2A to 2F are performed in the same manner as in the method in accordance with the first exemplary embodiment of the present invention, and a process shown in FIG. 3A is then performed.

Referring to FIG. 3A, an isolation dielectric layer 180 is formed to have a thickness enough to fill the second trench T2. The isolation dielectric layer 180 may be formed by a process of performing LP-CVD to deposit an oxide layer.

Referring to FIG. 3B, a second isolation layer 180A is formed at the same level as the upper surface of the first isolation layer 130, while filling the second trench T2. The second isolation layer 180A may be formed by the following process: a planarization process is performed until the upper surface of the first control-gate conductive layer 150 is exposed, and the isolation dielectric layer 180 buried in the second trench T2 is removed by a certain amount through a wet or dry etching process. The height of the upper surface of the second isolation layer 180A is preferably similar to that of the upper surface of the first isolation layer 130.

A multilayer of oxide-nitride-oxide (ONO) is formed over the entire surface of the resultant structure having the second conductive layer patterns 120B of which the sidewall is exposed through the etching process. Then, the multilayer is partially removed through, for example, a blanket process such that the multilayer remains only on the sidewalls of the secondary conductive layer patterns 120B, thereby forming a second inter-gate dielectric layer 200.

Referring to FIGS. 1 and 3C, a second control-gate conductive layer 190 is formed over the entire surface of the resultant structure exposing the upper surface of the first control-gate conductive layer 150. The second control-gate conductive layer 190 may include a conductive material, for example, polysilicon.

A line-type hard mask pattern (not illustrated) is formed over the second control-gate conductive layer 190 so as to extend in the cross-sectional direction (the second direction shown in FIG. 1), and the second inter-gate dielectric layer 190, the second control-gate conductive layer 190, the second isolation layer 180A, the first control-gate conductive layer 150, the first inter-gate dielectric layer 140, the secondary conductive layer pattern 120B, and the tunnel dielectric layer 110 are etched using the hard mask pattern as an etch mask.

Through this process, floating gates 120C arranged in a matrix type over the active region 100A are formed from the line-type secondary conductive layer pattern 120B.

Furthermore, the stacked structure of the first control-gate conductive layer 150 and the second control-gate conductive layer 190, which are etched by the process, serves as a control gate 190A and has a line shape extending in the cross-sectional direction while overlapping and interposing the first and second inter-gate dielectric layers 140 and 200 and the floating gates 120C arranged in the cross-sectional direction.

The second exemplary embodiment of the present invention is different from the first embodiment of the present invention in that the upper surfaces of the first and second isolation layers 130 and 180A are set at the same level and the exposed sidewall of the secondary conductive pattern 120B and the second control-gate conductive layer 190 are overlapped with the second inter-gate dielectric layer 200 interposed therebetween. Accordingly, an overlap area between the floating gate 120C and the control gate 190A may be increased to raise a coupling ratio which is defined at a ratio of an operation voltage applied to the control gate 190A and a voltage induced in the floating gate 120C.

In accordance with the exemplary embodiments of the present invention, it may be possible to provide the isolation layer which is capable of improving a device isolation characteristic while increasing the integration degree of the nonvolatile memory device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a nonvolatile memory device, comprising:
    forming a substrate structure having a tunnel dielectric layer and a floating-gate conductive layer formed over an active region defined by a first isolation layer;
    forming a first inter-gate dielectric layer and a first control-gate conductive layer over the substrate structure;
    forming a trench by etching the first control-gate conductive layer, the first inter-gate dielectric layer, the floating-gate conductive layer, the tunnel dielectric layer, and the active region to a given depth;
    forming a second isolation layer to fill the trench; and
    forming a second control-gate conductive layer over the resultant structure having the second isolation layer formed therein.

2. The method of claim 1, wherein the forming of the trench is performed wherein a bottom surface of the trench is positioned at a higher level than a bottom surface of the first isolation layer.

3. The method of claim 2, wherein a height of the surface of the second isolation layer is substantially identical to that of the first isolation layer.

4. The method of claim 2, wherein the second isolation layer is formed to completely fill the trench.

5. The method of claim 1, wherein the forming of the trench is performed by using a mask pattern which exposes a central portion of the floating-gate conductive layer.

6. The method of claim 1, further comprising forming a second inter-gate dielectric layer on an exposed surface of the floating-gate conductive layer, after the forming of the second isolation layer.

7. The method of claim 1, further comprising forming a liner layer on an inner wall of the trench, after the forming of the trench.

8. The method of claim 1, wherein the first and second isolation layers are formed of the same material.

9. The method of claim 1, wherein the active region and the first and second isolation layers are formed in a line type extending in one direction.

10. The method of claim 9, further comprising forming a floating gate and a control gate by etching the second control-gate conductive layer, the second isolation layer, the first control-gate conductive layer, the first inter-gate dielectric layer, the floating-gate conductive layer, and the tunnel dielectric layer.

11. The method of claim 10, wherein the forming of the floating gate and the control gate is performed by using a line-type mask pattern extending in a direction crossing the active region and the first and second isolation layers.

* * * * *